United States Patent
Verspecht et al.

(10) Patent No.: US 12,158,491 B1
(45) Date of Patent: Dec. 3, 2024

(54) PHASE DISTORTION MEASUREMENT

(71) Applicant: Keysight Technologies, Inc., Santa Rosa, CA (US)

(72) Inventors: Jan Verspecht, Londerzeel (BE); Bogdan Szafraniec, Sunnyvale, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 306 days.

(21) Appl. No.: 17/874,517

(22) Filed: Jul. 27, 2022

(51) Int. Cl.
   *G01R 31/26* (2020.01)
(52) U.S. Cl.
   CPC ..... *G01R 31/2635* (2013.01); *G01R 31/2633* (2013.01)
(58) Field of Classification Search
   CPC ............... G01R 31/26; G01R 31/2635; G01R 31/2633; H01S 5/0683; G02B 27/00; G02B 27/0025
   See application file for complete search history.

(56) References Cited

U.S. PATENT DOCUMENTS

| | | | |
|---|---|---|---|
| 5,687,261 A * | 11/1997 | Logan | H04B 10/50 385/11 |
| 10,348,412 B1 | 7/2019 | Xue et al. | |
| 10,454,600 B2 | 10/2019 | Leibfritz et al. | |

FOREIGN PATENT DOCUMENTS

JP 2001268016 A * 9/2001

OTHER PUBLICATIONS

Anatoli A. Chtcherbakov et al., "Optical Heterodyne Method for Amplitude and Phase Response Measurements for Ultrawideband Electrooptic Modulators," IEEE Photonics Technology Letters, vol. 19, No. 1, Jan. 1, 2007, pp. 18-20.
"Jacobi-Anger expansion", From Wikipedia, Apr. 26, 2022, https://en.wikipedia.org/wiki/Jacobi%E2%80%93Anger_expansion, 3 pgs.

* cited by examiner

*Primary Examiner* — Son T Le

(57) ABSTRACT

A test circuit for measuring phase distortion includes a first laser, a second laser and a photo diode. The first laser is tuned to a first frequency f1 and generates a first optical signal. The second laser is tuned to a second frequency f2 and generates a second optical signal and phase modulates the second optical signal with a periodic signal with a repetition frequency fM. The photo diode receives and mixes the first optical signal and the second optical signal, and produces a first tone at a third frequency f3, which is a carrier frequency equal to an absolute value of a difference between the second frequency f2 and the first frequency f1, a second tone at a fourth frequency f4 at a difference between the third frequency f3 and the repetition frequency fM, and a third tone at a fifth frequency f5 at a sum of the third frequency f3 and the repetition frequency fM.

20 Claims, 10 Drawing Sheets

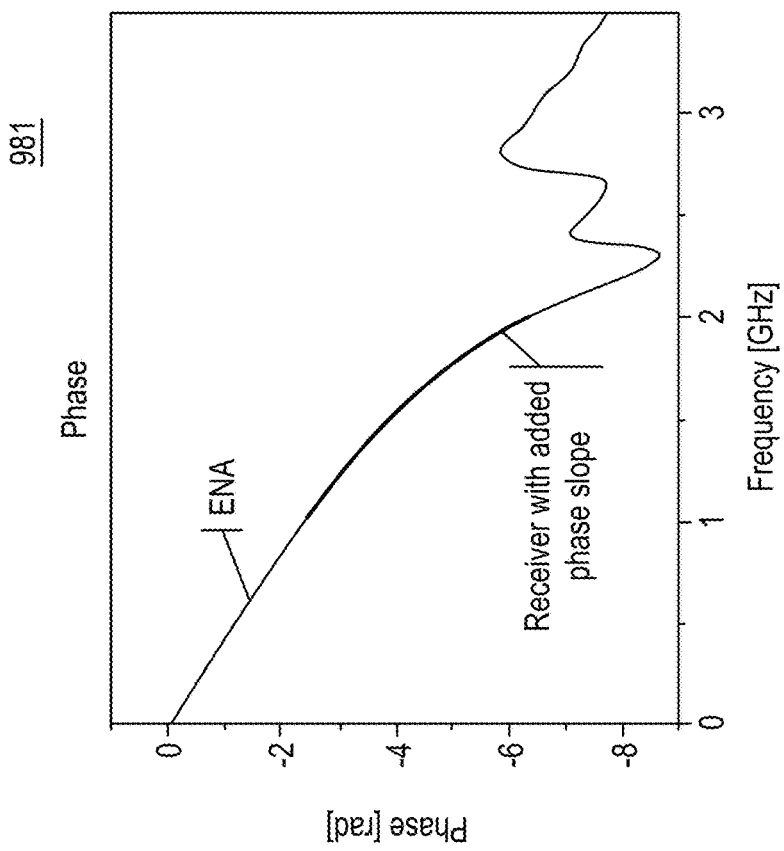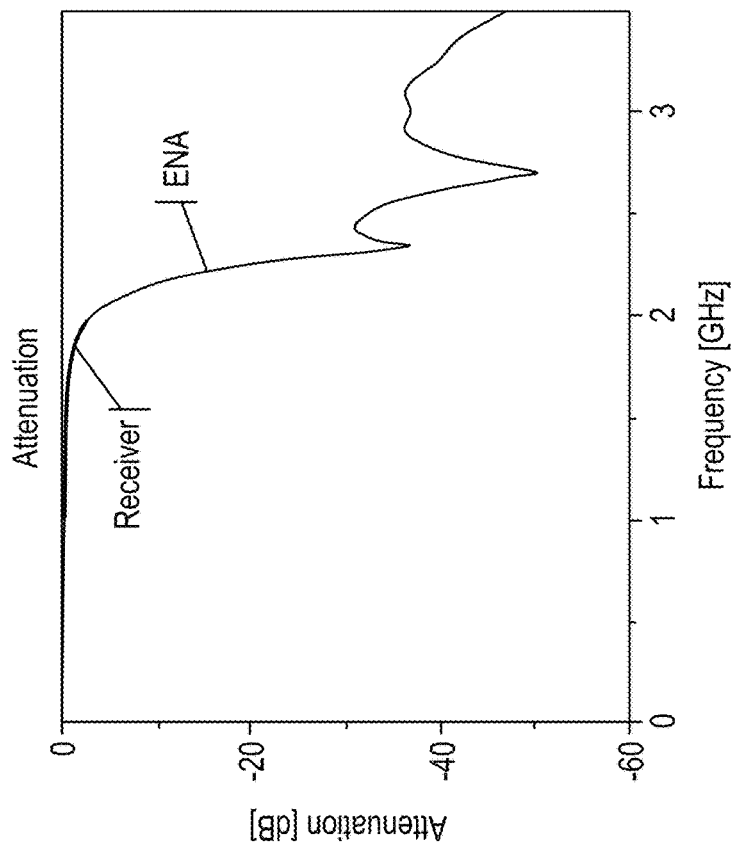
FIG.9

US 12,158,491 B1

PHASE DISTORTION MEASUREMENT

BACKGROUND

When properly calibrated, a receiver has a constant amplitude and a linear phase within the bandwidth of the receiver. A linear phase implies that all frequency components within the receiver bandwidth have the same delay. If the amplitude is not constant and/or if the phase within the receiver bandwidth is not linear, the signal received at the receiver is distorted. Deviation from a linear phase is known as phase distortion. Existing broadband phase distortion measurement is based on creating a repetitive narrow pulse reference signal by exciting a photo diode with femtosecond scale optical pulses. The existing broadband phase distortion measurement encounters two unknowns, i.e., delay and phase offset drift, which must be addressed to obtain stable and accurate measurements of a phase relationship.

SUMMARY

According to an aspect of the present disclosure, a test circuit for measuring phase distortion includes a first laser, a second laser, and a photo diode. The first laser is tuned to a first frequency f1 and generates a first optical signal. The second laser is tuned to a second frequency f2 and generates a second optical signal and phase modulates the second optical signal with a periodic signal with a repetition frequency fM. The photo diode receives and mixes the first optical signal and the second optical signal, and produces a first tone at a third frequency f3, which is a carrier frequency equal to an absolute value of a difference between the second frequency f2 and the first frequency f1, a second tone at a fourth frequency f4 at a difference between the third frequency f3 and the repetition frequency fM, and a third tone at a fifth frequency f5 at a sum of the third frequency f3 and the repetition frequency fM. A receiver-under-test (RUT) is configured to measure a first phasor of the first tone, a second phasor of the second tone, and a third phasor at the third tone, and calculate phase deviations between measurements of the first phasor, the second phasor and the third phasor. The calculated phase deviations are compared with known phase relationships between the first tone, the second tone and the third tone to measure phase distortion of the RUT.

According to another aspect of the present disclosure, a test system for measuring phase distortion includes a first laser, a second laser, a photo diode and a receiver-under-test (RUT). The first laser is tuned to a first frequency f1 and generates a first optical signal. The second laser is tuned to a second frequency f2 and generates a second optical signal and phase modulates the second optical signal with a periodic signal with a repetition frequency fM. The photo diode receives and mixes the first optical signal and the second optical signal, and produces a first tone at a third frequency f3, which is a carrier frequency equal to an absolute value of a difference between the second frequency f2 and the first frequency f1, a second tone at a fourth frequency f4 at a difference between the third frequency f3 and the repetition frequency fM, and a third tone at a fifth frequency f5 at a sum of the third frequency f3 and the repetition frequency fM. The receiver-under-test (RUT) measures a first phasor of the first tone, a second phasor of the second tone, and a third phasor at the third tone, and calculates phase deviations between measurements of the first phasor, the second phasor and the third phasor. The calculated phase deviations are compared with known phase relationships between the first tone, the second tone and the third tone to measure phase distortion of the RUT.

According to another aspect of the present disclosure, a test method for measuring phase distortion includes generating a first optical signal from a first laser tuned to a first frequency f1; generating a second optical signal from a second laser tuned to a second frequency f2 and phase modulating the second optical signal with a periodic signal with a repetition frequency fM; mixing, by a photo diode, the first optical signal and the second optical signal; producing, by the photo diode, a first tone at a third frequency f3, which is a carrier frequency equal to an absolute value of a difference between the second frequency f2 and the first frequency f1, a second tone at a fourth frequency f4 at a difference between the third frequency f3 and the repetition frequency fM, and a third tone at a fifth frequency f5 at a sum of the third frequency f3 and the repetition frequency fM. A receiver-under-test (RUT) is configured to measure a first phasor of the first tone, a second phasor of the second tone, and a third phasor at the third tone, and calculate phase deviations between measurements of the first phasor, the second phasor and the third phasor. The calculated phase deviations are compared with known phase relationships between the first tone, the second tone and the third tone to measure phase distortion of the RUT.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 9 illustrates an amplitude and phase response of a filter, in accordance with a representative embodiment.

DETAILED DESCRIPTION

Figure 1:
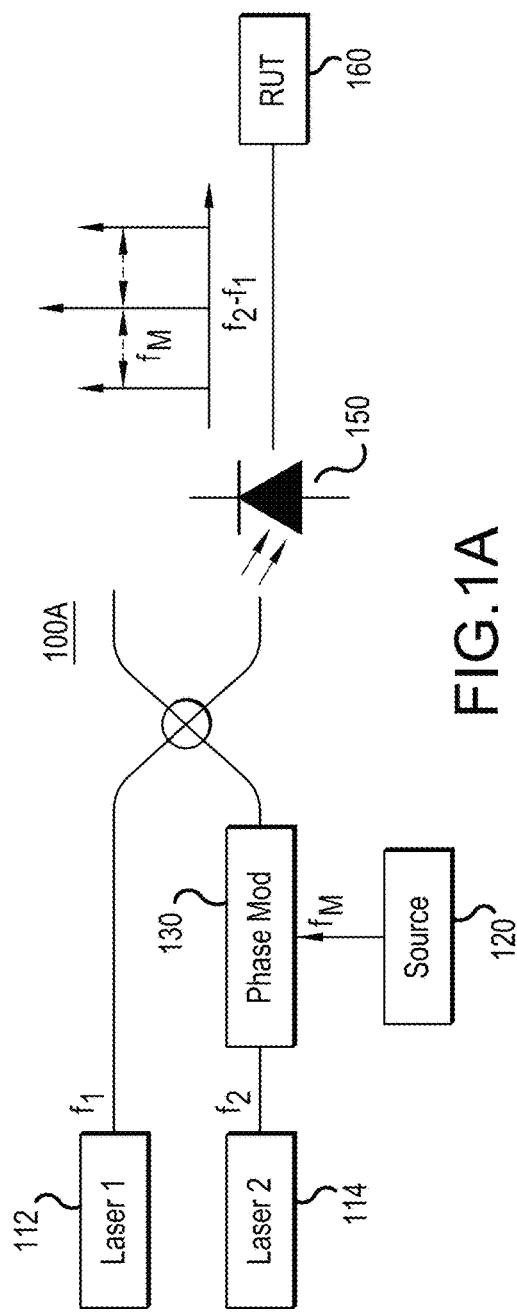
FIG. 1A illustrates a test circuit for phase distortion measurement, in accordance with a representative embodiment.
FIG. 1B illustrates another test circuit for phase distortion measurement, in accordance with a representative embodiment.

In the following detailed description, for the purposes of explanation and not limitation, representative embodiments disclosing specific details are set forth in order to provide a thorough understanding of embodiments according to the present teachings. However, other embodiments consistent with the present disclosure that depart from specific details disclosed herein remain within the scope of the appended claims. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. Definitions and explanations for terms herein are in addition to the technical and scientific meanings of the terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below.

As described herein, phase distortion of high-frequency broadband receivers may be characterized based on generating 3-tone calibration signals with an accurately known phase relationship through optical methods.

FIG. 1A illustrates a test circuit for phase distortion measurement, in accordance with a representative embodiment.

The test circuit 100A in FIG. 1A is a test circuit for measuring phase distortion of a receiver-under-test. The test circuit 100A includes a first laser 112, a second laser 114, a source 120, a phase modulator 130, a photo diode 150 and a receiver-under-test 160 (RUT). The test circuit 100A is configured to provide an accurate characterization of the phase distortion of the receiver-under-test 160. The test circuit 100A is configured to measure, for example, broadband modulated signals at mm-wave frequencies between 30 GHz and 300 GHz.

As an example, a system with the first laser 112, the second laser 114, the source 120, the phase modulator 130, and the photo diode 150 may be pre-configured to test multiple receivers-under-test including the receiver-under-test 160 (RUT). One or more of the first laser 112, the second laser 114, the source 120, the phase modulator 130, and the photo diode 150 may be provided, for example, as an integrated apparatus with elements connected together for use in testing various receivers-under-test.

The test circuit 100A is configured to generate 3-tone signals with a known phase relationship between the tones. The 3-tone signals are received and then measured by the receiver-under-test 160 and enable the calculation of the phase deviation at the receiver-under-test 160. The 3-tone signals are generated by the photo diode 150 or another optical mechanism. 3-tone signals may be used according to the teachings herein to eliminate two unknowns of delay and phase offset drift present in the signal received at the receiver-under-test 160, so that measurements at the receiver-under-test 160 will reflect phase deviation due to the receiver-under-test 160.

The first laser 112 is tunable and is tuned to a first frequency f1 and generates a first optical signal. As an example, the first laser 112 may operate at 190 THz. The first optical signal may be a continuous wave tone.

The second laser 114 is tunable and is tuned to a second frequency f2 and generates a second optical signal. The second optical signal is phase modulated by the phase modulator 130. As an example, the second laser 114 may be offset in frequency from the first laser 112 by an amount equal to a tone spacing.

A carrier frequency fC may be the middle frequency of the three tones to be generated. As an example, the carrier frequency may be 200 gigahertz (GHz), and the second frequency f2 may be 190.2 THz. The laser frequencies f1 and f2 may be free running and controlled through temperature. In some embodiments, the laser frequencies f1 and f2 do not share a common clock such that they may be subject to phase noise and frequency drift. The use of the 3-tone signals eliminates consideration of the phase noise and frequency drift due to the first laser 112 and the second laser 114 when measured at the receiver-under-test 160. Notably, the optical signals have a frequency (at multiple THz) and fC is a signal at RF frequency.

The source 120 is a signal source that generates a periodic signal at a repetition frequency fM. The source 120 may be locked in common with the receiver-under-test 160 to a reference clock. For example, the source 120 and the receiver-under-test 160 may be locked in common to a 10 megahertz (MHz) reference clock. Locking the source 120 and the receiver-under-test 160 in common to a reference clock implies that accuracy of the frequency separation between the three tones will be maintained.

The phase modulator 130 modulates the second optical signal with the periodic signal with the repetition frequency fM.

The first optical signal and the modulated second optical signal are sent to the photo diode 150. The photo diode 150 receives and mixes the first optical signal and the modulated second optical signal and outputs the 3-tone signal. Mixing of the first optical signal and the modulated second optical signal results in generation of the 3-tone signal as a phase modulated electrical signal at the output of the photo diode 150. In the context of the teachings herein, the 3-tone signal output from the photo diode 150 has a known second order phase difference between the three tones of the 3-tone signal provided to the receiver-under-test 160. The phase modulated electrical signal at the output of the photo diode 150 has a third frequency f3 which is the carrier frequency fC equal to the absolute value of the difference between the second frequency f2 and the first frequency f1. The third frequency f3 which is the carrier frequency fC may be derived from equation (1):

$$fC=|f2-f1| \qquad (1):$$

As an example of the three tones, the carrier frequency for the first tone may be 200 gigahertz (GHz), the fourth frequency for the second tone may be 198.1 gigahertz (GHz), and the fifth frequency for the third tone may be 201.9 gigahertz (GHz), so that the photo diode 150 performs a mixing operation and outputs the 3-tone signal with tones at 200 gigahertz, 198.1 gigahertz and 201.9 gigahertz. As another example, the carrier frequency for the first tone may be 200 gigahertz (GHz), the fourth frequency f4 for the second tone may be 180 gigahertz, and the fifth frequency f5 for the third tone may be 220 gigahertz, so that the photo diode 150 performs a mixing operation and outputs the 3-tone signal with tones at 200 gigahertz, 180 gigahertz and 220 gigahertz.

When the first optical signal and the modulated second optical signal are combined, more than three tones may be present. Because the phase modulation by the phase modulator 130 is periodic, the spectrum of the phase modulated electrical signal at the output of the photo diode 150 is discrete. The spectrum contains several tones to the left and to the right of the carrier frequency fC with the tone spacing being equal to the repetition frequency fM. Although all tones can be used, the phase distortion measurement described herein considers 3-tones, i.e., the first tone at the carrier frequency fC, and the second tone at the fourth frequency f4 on one side of the carrier frequency fC and the third tone at the fifth frequency f5 on the other side of the carrier frequency fC. The respective frequencies of the tones are thus fC−fM=f4, fC=f3, and fC+fM=f5. As a result, the photo diode 150 produces the 3-tone signal with a first tone at the third frequency f3, i.e., the carrier frequency fC, a second tone at the fourth frequency f4 at a difference between the third frequency f3 and the repetition frequency fM, and a third tone at the fifth frequency f5 at a sum of the third frequency f3 and the repetition frequency fM.

Using three tones, the second order difference between the phases of the three tones in the 3-tone signal produced by the photo diode 150 and received at the receiver-under-test 160 is an invariant versus a constant phase offset and a linear phase slope. If the second order difference of the first tone at the third frequency f3, the second tone at the fourth frequency f4 and the fifth tone at the fifth frequency f5 due to the photo diode 150 is known, the second order difference as measured through the receiver-under-test 160 will not change, and instead will be the same number, independent of the phase drift which is due to elements of the receiver-under-test 160. Generating three tones with a known second order difference, the second order difference due to the channel at the receiver-under-test 160 may be accurately measured. In other words, using pre-knowledge of the second order difference of the first tone at the third frequency f3, the second tone at the fourth frequency f4 and the fifth tone at the fifth frequency f5 due to the photo diode 150, the 3-tone signal from the photo diode 150 can be used in measurements at multiple different receivers-under-test to determine the various phase drifts due to the elements of the different receivers under test.

The phase relationship between the three tones at the receiver-under-test 160 is expressed by equation (2):

$$\arg(-(P\_)(P+)(P0)\hat{}(-2))=0, \qquad (2):$$

with P_ equal to the second phasor of the tone at the fourth frequency f4, P0 equal to the first phasor of the tone at the carrier frequency fC, and with P+ equal to the third phasor of the tone at the fifth frequency f5. Phasors represent measured quantities of the phases of the three tones at the receiver-under-test 160.

A receiver-under-test 160 is a digital receiver that received the 3-tone signal with the three tones and outputs digital representations of amplitudes and phases of the tones. The receiver-under-test 160 has components such as a mixer, a local oscillator, an analog-to-digital converter (ADC), and these components add delay and phase drift to the 3-tone signal. The teachings herein provide mechanisms to eliminate the delay and phase drift added at the receiver-under-test 160.

In FIG. 1A, the receiver-under-test 160 is configured to measure a first phasor of the first tone, a second phasor of the second tone, and a third phasor at the third tone, and calculate phase deviations between measurements of the first phasor, the second phasor and the third phasor. The phase deviations between measurements of the first phasor, the second phasor and the third phasor are calculated as deviations from linearity at the third frequency f3, the fourth frequency f4 and the fifth frequency f5.

The 3-tones are measured by the receiver-under-test 160. The measured phasors may be referred to as M_, M0, and M+, and are expressed by equations (3), (4) and (5):

$$M\_=(P\_)H(fC-fM)\exp(j((\theta LO)+2\pi(fC-fM)\tau)) \qquad (3):$$

$$M0=(P0)H(fC)\exp(j((\theta LO)+2\pi(fC)\tau)), \text{ and} \qquad (4):$$

$$M+=(P+)H(fC+fM)\exp(j((\theta LO)+2\pi(fC+fM)\tau)), \text{ with} \\ \theta LO \qquad (5):$$

being an unknown phase of a local oscillator at the receiver-under-test 160, with τ being the unknown delay of the receiver-under-test 160, and specifically the unknown delay of the analog-to-digital converter (ADC) at the receiver-under-test 160. H represents the frequency response function of the receiver-under-test 160. The measured phase distortion θD due to the components of the receiver-under-test 160 is then calculated by the receiver-under-test 160 using equation (6):

$$\theta D=\arg(-(M\_)(M+)(M0)\hat{}(-2)). \qquad (6):$$

Substitution of equations (2), (3), (4) and (5) into equation (6) results in equations (7) and (8):

$$\theta D=\arg(H(fC-fM)H(fC+fM)H(fC)\hat{}(-2), \text{ or} \qquad (7):$$

$$\theta D=\arg(H(fC-fM))+\arg(H(fC+fM)-2\arg(H(fC)). \qquad (8):$$

Figure 3:
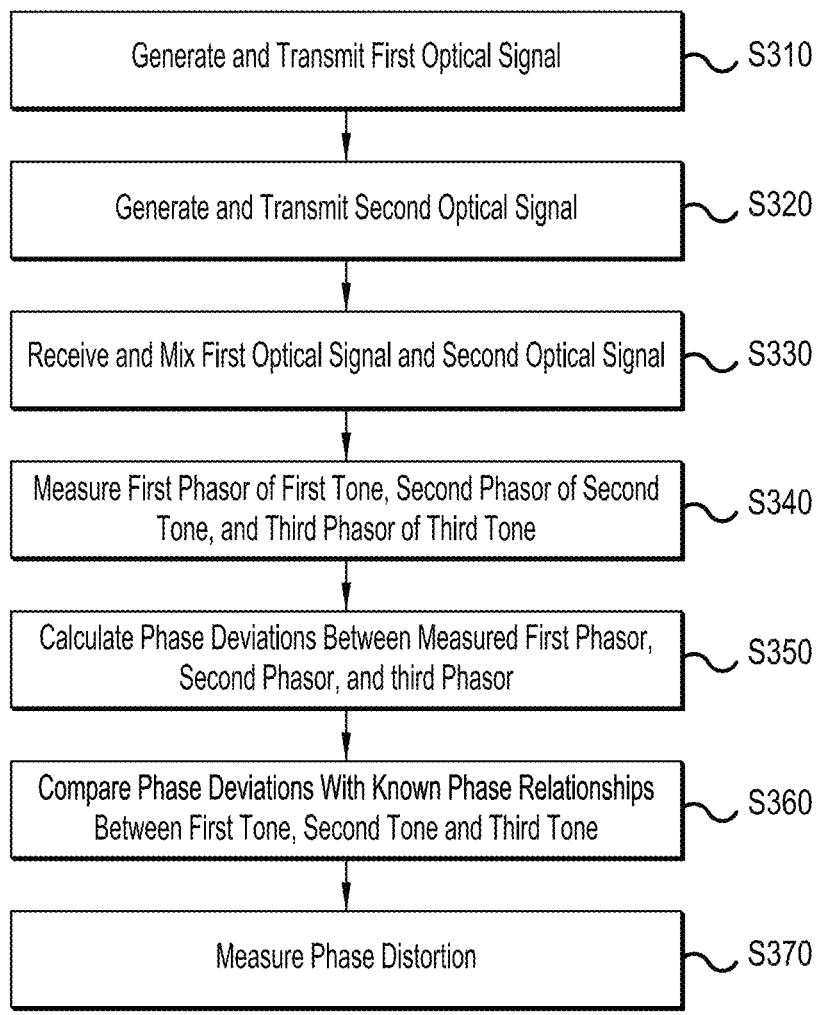
FIG. 3 illustrates a method for phase distortion measurement, in accordance with a representative embodiment.

Measurement of the phasors and calculation of the phase deviations between the measured phasors due to the components of the receiver-under-test 160 is described in more detail for the method of FIG. 3. Each measurement at the receiver-under-test 160 will have two unknown quantities. The above equations (2) through (8) demonstrate that the second order difference in phases in the 3-tone signal received at the receiver-under-test is insensitive to delay when measured at the local oscillator phase of the receiver-under-test 160, and can therefore be taken into account and eliminated when determining the phase distortion θD due to the components of the receiver-under-test 160. The receiver-under-test 160 in FIG. 1A is therefore configured to compare the calculated phase deviations with the known phase relationships between the first tone, the second tone and the third tone to measure phase distortion due to the components of the receiver-under-test 160.

The measured phase distortion θD has no dependency on the unknown θLO and τ and represents the second order difference of the phase of the frequency transfer function H(f) which is due to the receiver-under-test 160. Being a second order difference, the measured phase distortion due to the 3-tone signal received at the receiver-under-test 160 is invariant versus a constant phase offset as well as versus a linear phase slope, and this implies that the measured phase distortion is an invariant to the local oscillator phase of the receiver-under-test 160 as well as to the starting time of the analog-to-digital converter of the receiver-under-test 160.

As set forth above, in embodiments based on FIG. 1A, the receiver-under-test is configured to measure phases of the phasors. Based on the phase measurements by the receiver-under-test 160, the receiver-under-test 160 is configured to calculate phase distortion due to the components of the receiver-under-test 160. Even though the receiver-under-test 160 is the device under test (DUT) in FIG. 1A, the capabilities of the receiver-under-test 160 are also used to perform aspects of the testing including measurement of the phasors and calculation of the phase distortion due to the elements of the receiver-under-test 160.

An example of the receiver-under-test 160 is an oscilloscope. An example of how phase distortion due to an oscilloscope is measured is by acquiring the down-converted signal, transforming the digitized down-converted signal from the time domain to the frequency domain, and then measuring amplitude and phase at predetermined frequencies corresponding to tones in the 3-tone signal. As an example a 200 gigahertz signal may be down-converted to 50 gigahertz with tones at 20 gigahertz on each side of 50 gigahertz, so at 30 gigahertz and 70 gigahertz. The down-converted signal is digitized as a time-domain signal, then subjected to a Fourier transform to transform the digitized time-domain signal from the time domain to the frequency domain. The teachings herein address instability in the tones due to drifts and phase variations present in the received 3-tone signal. The Fourier transform may be a fast Fourier transform (FFT). The oscilloscope may allow selection of bandpass filters to apply around each of the tones, and then an inverse fast Fourier transform (FFT) may be applied to each of the filtered tones to obtain three time series, one for each tone that describes the phase of that tone versus time. The oscilloscope may then calculate an average of the second order difference versus time. The teachings herein solve issues of delay phase drift and phase drift in the local oscillator of the oscilloscope.

FIG. 1B illustrates another test circuit for phase distortion measurement, in accordance with a representative embodiment.

The test circuit 100B in FIG. 1B again includes a first laser 112, a second laser 114, a source 120, a phase modulator 130, a photo diode 150 and a receiver-under-test 160 (RUT). The test circuit 100B also includes a computer 170. The computer 170 is configured to calculate phase distortion due to components of the receiver-under-test 160 based on the phases of the phasors measured by the receiver-under-test 160. In embodiments based on FIG. 1B, the computer 170 may be an external computer configured to perform some of the testing of the receiver-under-test 160, including calculation of the phase distortion of the receiver-under-test 160.

The test circuit 100B is configured to provide an accurate characterization of the phase distortion of the receiver-under-test 160. The test circuit 100B is configured to measure, for example, broadband modulated signals at mm-wave frequencies between 30 GHz and 300 GHz. The test circuit 100B is configured to generate 3-tone signals with an a priori known phase relationship between tones. The 3-tone signals are then measured by the receiver-under-test 160 and enable the calculation of the phase deviation from linearity due to the components of the receiver-under-test 160 at the frequencies of the three tones. The 3-tone signals are generated by the photo diode 150 or another optical mechanism.

The computer 170 may includes a set of software instructions that can be executed to cause the computer 170 to perform functions attributed to the computer 170. The computer 170 may operate as a standalone device or may be connected, for example, using a network, to other computer systems or peripheral devices. The computer 170 performs logical processing based on digital signals received via an analog-to-digital converter. The computer 170 may be implemented as or incorporated into various devices, such as a workstation that includes a controller, a stationary computer, a mobile computer, a personal computer (PC), a laptop computer, a tablet computer, or any other machine capable of executing a set of software instructions (sequential or otherwise) that specify actions to be taken by that machine. The computer 170 may includes a processor which executes instructions to implement aspects of methods and processes described herein. A processor is tangible and non-transitory. A processor may be a general-purpose processor or may be part of an application specific integrated circuit (ASIC). The processor may also be a microprocessor, a microcomputer, a processor chip, a controller, a microcontroller, a digital signal processor (DSP), a state machine, or a programmable logic device. The processor may also be a logical circuit, including a programmable gate array (PGA), such as a field programmable gate array (FPGA), or another type of circuit that includes discrete gate and/or transistor logic. The processor may be a central processing unit (CPU), a graphics processing unit (GPU), or both. Additionally, any processor described herein may include multiple processors, parallel processors, or both. Multiple processors may be included in, or coupled to, a single device or multiple devices. The computer 170 may further include one or more memories such as a main memory and a static memory, where memories in the computer 170 communicate with each other and the processor via a bus. "Memory" is an example of a computer-readable storage medium. Computer memory is any memory which is directly accessible to a processor. Examples of computer memory include, but are not limited to RAM memory, registers, and register files.

In an embodiment, dedicated hardware implementations, such as application-specific integrated circuits (ASICs), field programmable gate arrays (FPGAs), programmable logic arrays and other hardware components, are constructed to implement aspects of one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

Figure 2:
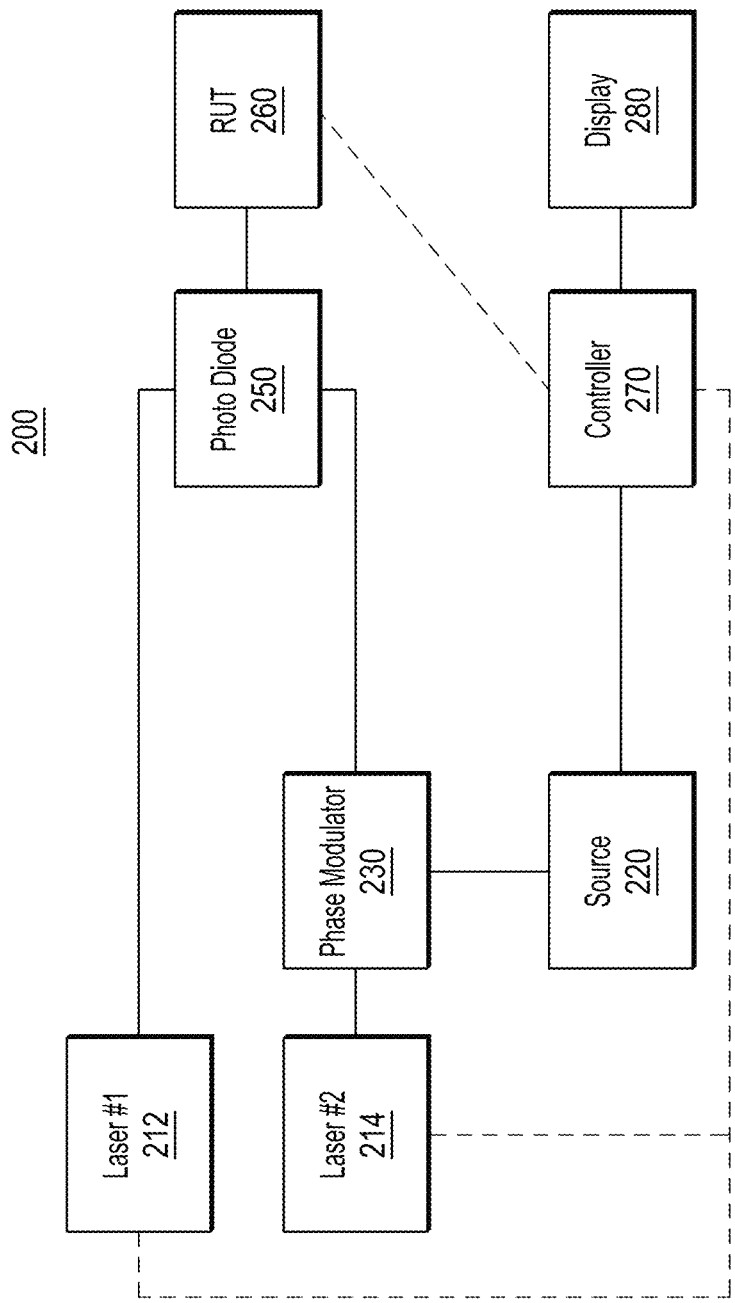
FIG. 2 illustrates a system for phase distortion measurement, in accordance with a representative embodiment.

FIG. 2 illustrates a system for phase distortion measurement, in accordance with a representative embodiment.

The system 200 in FIG. 2 includes a first laser #1 212, a second laser #2 214, a source 220, a phase modulator 230, a photo diode 250, a RUT 260, a controller 270 and a display 280. The first laser #1 212, the second laser #2 214, the source 220, the phase modulator 230, the photo diode 250 and the RUT 260 may correspond to the test circuit 100A in FIG. 1A or the test circuit 100B in FIG. 1B. The controller 270 may correspond to the computer 170 in FIG. 1B, and the display 280 may be provided as an accessory to the controller 270.

As in the embodiments of FIG. 1A and FIG. 1B, a 3-tone signal with three tones with a well-defined phase relationship are output from the photo diode 250. The three tones have a phase dispersion that is equal to pi.

The system 200 in FIG. 2A is a system for phase distortion measurement and includes components that may be provided together or that may be distributed. The controller 270 includes at least a memory that stores instructions and a processor that executes the instructions. In some embodiments, multiple different elements of the system 200 in FIG. 2 may include a controller such as the controller 270. The controller 270 may be configured to perform calculations of phase deviations between measurements of phasors from the RUT 260, and may also be configured to measure phase distortion of the RUT 260 based on the calculations. In some embodiments, however, the RUT 260 may be configured to perform such calculations and relevant measurements.

The display 280 may be local to the controller 270 or may be remotely connected to the controller 270. The display 280 may be connected to the controller 270 via a local wired interface such as an Ethernet cable or via a local wireless interface such as a Wi-Fi connection. The display 280 may be interfaced with other user input devices by which users can input instructions, including mouses, keyboards, thumbwheels and so on. The display 280 may be a monitor such as a computer monitor, a display on a mobile device, an augmented reality display, a television, an electronic whiteboard, or another screen configured to display electronic imagery. The display 280 may also include one or more input interface(s) that may connect to other elements or components, as well as an interactive touch screen configured to display prompts to users and collect touch input from users.

User interfaces displayed on the display 280 may include imagery of types shown in FIG. 4, FIG. 5, FIG. 6, FIG. 7, FIG. 8, FIG. 9 and FIG. 10. For example, the controller 270 and/or the RUT 260 may provide results of measurements of phasors and calculations of phase deviations for display on the display 280.

FIG. 3 illustrates a method for phase distortion measurement, in accordance with a representative embodiment.

The method of FIG. 3 starts at S310 by generating and transmitting a first optical signal. The first optical signal may be generated and transmitted by any of the first laser 112 or the first laser 212 in embodiments herein.

At S320, the method of FIG. 3 includes generating and transmitting a second optical signal. The second optical signal may be generated and transmitted by any of the second laser 114 or the second laser 214 in embodiments herein. Additionally, S310 and S320 may be performed simultaneously rather than in sequence as shown.

At S330, the method of FIG. 3 includes receiving and mixing the first optical signal and the second optical signal. The receiving and mixing at S330 may be performed by the photo diode 150 in FIG. 1A or FIG. 1B, or the photo diode 250 in FIG. 2.

At S340, the method of FIG. 3 includes measuring a first phasor of the first tone, a second phasor of the second tone, and a third phasor of the third tone. The measuring of phasors at S340 may be performed by the receiver-under-test 160 in FIG. 1A or FIG. 1B, or the RUT 260 in FIG. 2. Tone spacing may be significantly higher than the spectral linewidth caused by frequency drift and phase noise. Under such conditions, the three measured tones can be separated and expressed as three time varying envelopes P_−(t), P_0 (t) and P_+(t) including amplitude and phase. This is achieved by calculating a discrete fourier transform (DFT) on the total acquired envelope waveform from a digitizer of the receiver-under-test 160 or the RUT 260 and by applying, for example, brick-wall filters around each of the tones of the spectrum, followed by an inverse DFT for each filtered tone. In other words, the spectrum of the three tones is obtained, and a brick wall filter is applied to separate the three tones. Then the inverse DFT is applied to the three filtered datasets to obtain three complex time domain series that represent the time varying value of the tone amplitude and phase versus time. The measured phasors M_−(t), M0(t), and M+(t) are given by equations (9), (10) and (11) respectively:

$$(M\_)(t) = (P\_)\exp(j\theta(t))H(fC-fM)\exp(j((\theta LO)+2\pi(fC-fM)\tau))+(n\_)(t), \quad (9):$$

$$(M0)(t) = (P0)\exp(j\theta(t))H(fC)\exp(j((\theta LO)+2\pi(fC)\tau))+(n0)(t), \text{ and} \quad (10):$$

$$(M+)(t) = (P+)\exp(j\theta(t))H(fC+fM)\exp(j((\theta LO)+2\pi(fC+fM)\tau))+(n+)(t), \quad (11):$$

with θ(t) representing the effect of the laser phase noise and frequency drift and with n−(t), n0 (t) and n+(t) representing additive noise. It may be assumed in the above expressions that H(f) does not change significantly across the linewidth of the laser.

At S350, the method of FIG. 3 includes calculating phase deviations between the measured first phasor, second phasor and third phasor. The calculating at S350 may be performed by the receiver-under-test 160 in FIG. 1A, the computer 170 in FIG. 1B, or the controller 270 in FIG. 2. The measured phase dispersion may be a complex envelope θD (t), given by equation (12):

$$(\theta D)(t) = \arg((-(M\_)(t)(M+)(t)(M0)(t)^\wedge(-2)) = \arg(H(fC-fM)H(fC+fM)H(fC)^\wedge(-2)+N(t)), \quad (12):$$

with N(t) representing all terms containing at least one additive noise term.

The above equation reveals that because the phase noise θ(t) is correlated across the 3 tones, all laser phase noise and small frequency drift are eliminated from the measurement and θD (t) ends up being a constant plus an additive noise term. The additive noise is eliminated by calculating the average of θD (t) over the duration of the measurement. This results in a final measured value θDM given by equation (13):

$$(\theta DM) = \arg\left(1/T \int_0^T -(M\_)(t)(M_+)(t)(M_0)(t)^{-2} dt\right), \quad (13)$$

with T equal to the duration of the measured complex envelopes. The effect of the additive noise can be made arbitrarily small by increasing the integration time T. The procedure set forth above for S350 results in precise knowledge of the phase distortion for one frequency fc and one frequency fM. Performing the experiment with different values for fc and fM results in the knowledge of a complete phase distortion trace φD (f) with φD (f) related to H(f) as in equation 14:

$$(\varphi D)(f)=\arg(H(f))+A+Bf, \quad (14):$$

with A and B arbitrary constants. A represents the arbitrary phase of the LO and B is proportional to the arbitrary delay of the receiver-under-test. This expression may define an equivalence class that contains all phase characteristics that correspond to an identical phase distortion. In general, the procedure to construct φD (f) starts by fixing the value of φD (f) at 2 frequencies f1 and f2. Fixing these 2 values uniquely determines A and B, such that there is only one solution for the reconstructed φD (f). Typically, one will choose solutions expressed in equations (15) and (16:

$$(\varphi D)(f1)=0 \quad (15):$$

$$(\varphi D)(f2)=0. \quad (16):$$

Based on the above, a 3 tone experiment may be performed to determine φD (f) at one of the following frequencies: 2f1−f2, 2f2−f1 or (f1+f2)/2. In other words, the range of φD (f) may be extended to the left or to the right of the known values, or the value at the frequency in the middle of the interval [f1, f2] may be determined. The notation θD (fC, fM) may be used as the phase distortion measured using a carrier frequency fC and a modulation frequency fM. Consider the first case where the goal is to determine φD (2f1−f2). This is achieved by measuring θD (f1,f2−f1), which, may be given by equation (17):

$$(\theta D)(f1,f2-f1)=(\varphi D)(2f1-f2)+(\varphi D)(f2)-2(\varphi D)(f1). \quad (17):$$

Solving for φD (2f1−f2) results in the solution of equation (18):

$$\varphi D(2(f1)-(f2))=(\theta D)(f1,f2-f1)-(\varphi D)(f2)+2(\varphi D)(f1), \quad (18):$$

where all the quantities on the right are known. Repeating this procedure to the left and a similar procedure to the right results in the knowledge of φD (f) on a uniformly sampled set of frequencies across any desired range.

In another case, the goal may be to determine (φD)((f1+f2)/2). This is achieved by measuring θD ((f1+f2)/2,(f2−f1)/2), which, again considering equations (8) and (14), is given by equation (19):

$$(\theta D)((f1+f2)/2,(f2-f1)/2)=(\varphi D)(f1)+(\varphi D)(f2)-2(\varphi D)((f1+f2)/2). \quad (19):$$

Solving for φD ((f_1+f_2)/2) in equation (19) results in the expression of equation (20):

$$(\varphi D)((f1+f2)/2)=\tfrac{1}{2}((\varphi D)(f1)+(\varphi D)(f2)-(\theta D)((f1+f2)/2,(f2-f1)/2)). \quad (20):$$

Repeating the above procedure results in the knowledge of φD (f) on a grid with a finer resolution (f_2−f_1)/2. Combining the methods to both extend the grid and refine the grid enables to measure φD (f) with arbitrary sampling resolution.

At S360, phase deviations are compared with known phase relationships between the first tone, the second tone and the third tone. The comparison at S360 may be performed by the receiver-under-test 160 in FIG. 1A, the computer 170 in FIG. 1B, or the controller 270 in FIG. 2.

At S370, phase distortion is measured based on the comparison at S360. The phase distortion may be measured by the receiver-under-test 160 in FIG. 1A, the computer 170 in FIG. 1B, or the controller 270 in FIG. 2. The phase distortion reflects the difference between the known phase relationships and what is measured at S350, as the difference is attributable to the phase distortion the receiver-under-test 160 or the RUT 260.

Although not shown in FIG. 3, the method of FIG. 3 may be performed repeatedly to obtain the phase dispersion across the entire bandwidth of the receiver-under-test 160 or the RUT 260 with a very fine resolution. Multiple measurements with different tone spacings and different center frequencies may be applied. For example, the interval may be taken and cut in half and then repeatedly used to perform the method of FIG. 3. In other embodiments, a predefined resolution may be repeatedly applied from higher frequencies to lower frequencies or from lower frequencies to higher frequencies. The measurements in FIG. 3 may be repeated at different settings for different center frequencies and tone spacings so that the phase dispersion is determined accurately.

Figure 4:
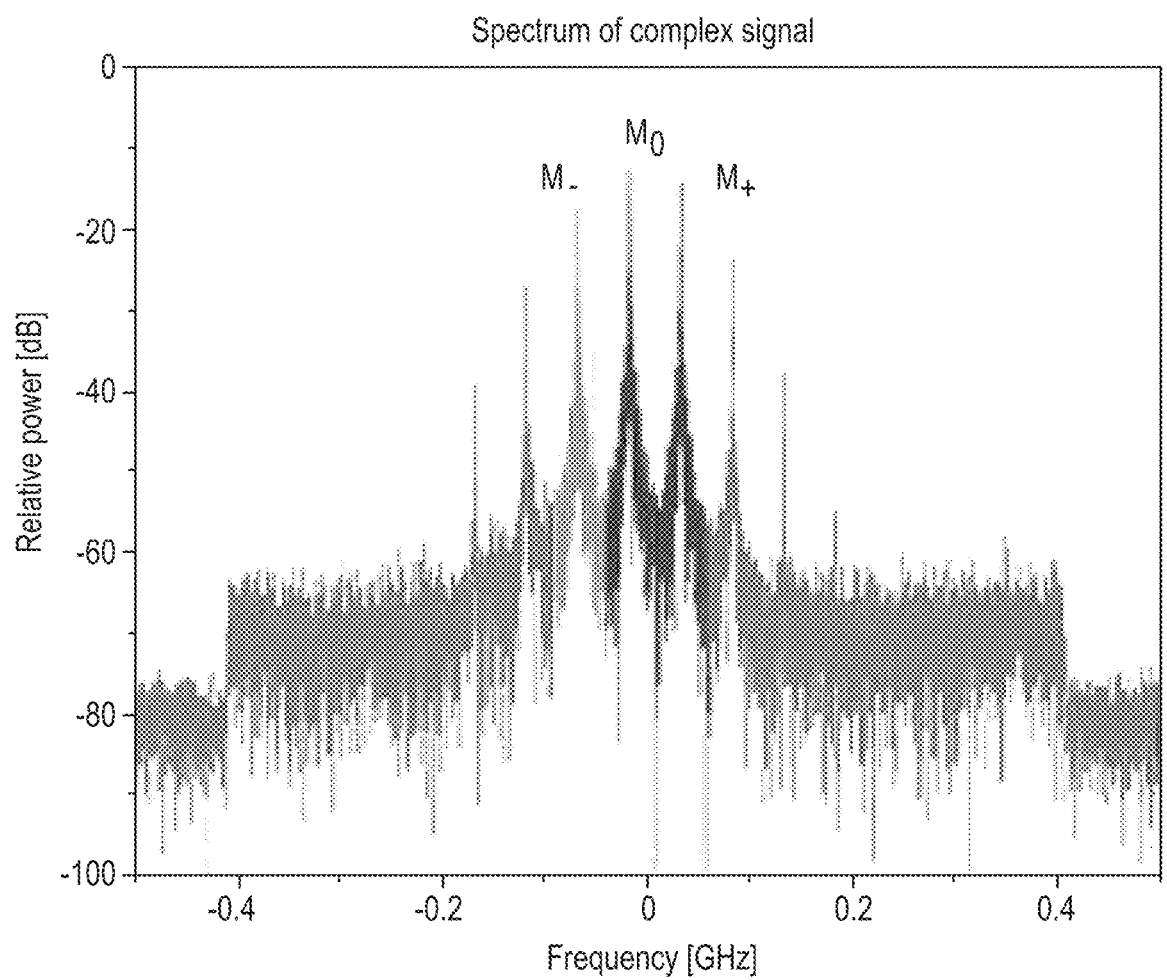
FIG. 4 illustrates spectrum of a phase modulated signal, in accordance with a representative embodiment.

FIG. 4 illustrates spectrum of a phase modulated signal, in accordance with a representative embodiment.

Since the frequency of the local oscillator of the tunable receiver is slightly higher that the frequency of the carrier, the carrier M_0 appears at a negative frequency. The spectral peaks are separated by the modulation frequency fM equal to 50 MHz. All peaks have the same Lorentzian shape related to the phase noise of the lasers. The carrier M0 and the sidebands M+ and M_− are filtered by brick-wall filters as indicated in FIG. 4 by coloring. For an ideal receiver, the invariant (−(M_)(M+)(M0)^(−2)) of (6) is a constant C. In a real measurement system, with a non-ideal receiver, the complex invariant w(t)=(−(M_)(M+)(M0)^(−2)) contains noise and its phase is altered by the receiver phase characteristics. Thus, the invariant w(t) provides the desired phase calibration information. The invariant w(t) was calculated for the signal shown in FIG. 4. The resulting invariant w(t) is shown in a complex plane in FIG. 5.

Figure 5:
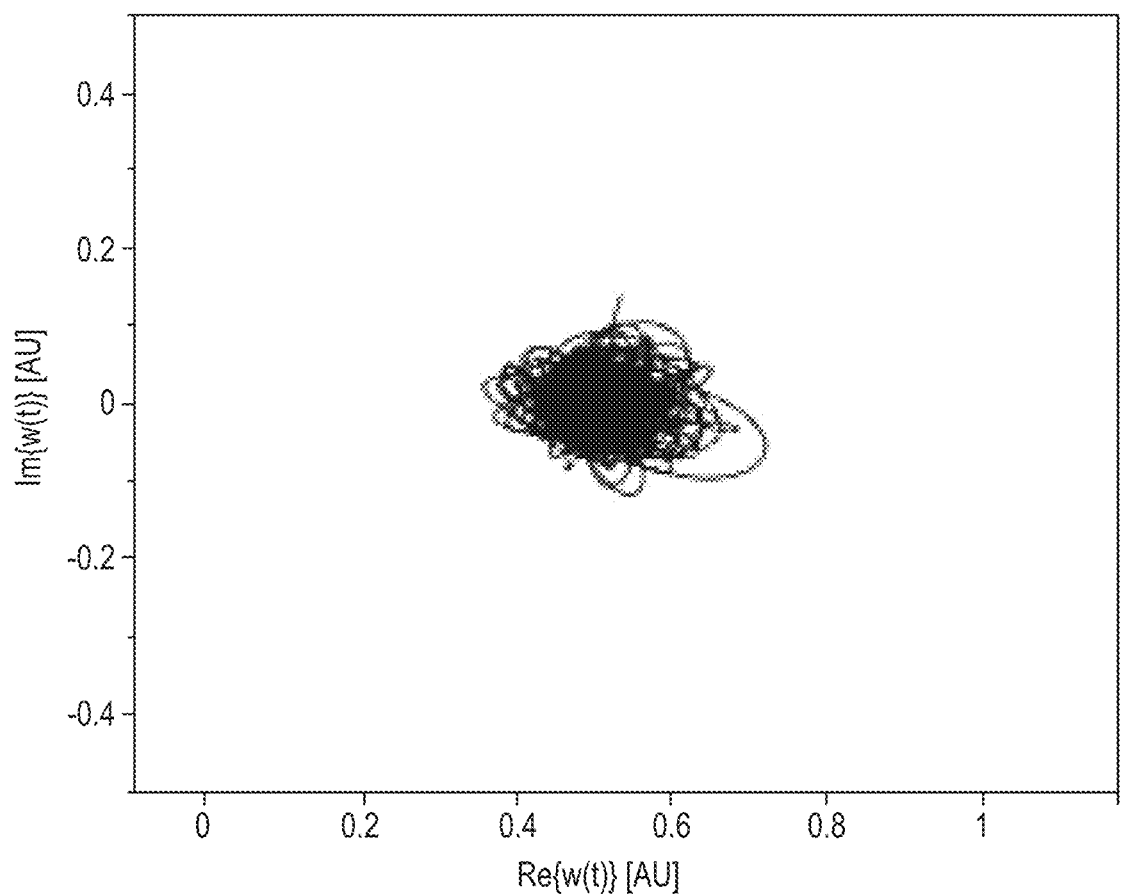
FIG. 5 illustrates an invariant w(t) for the phase modulate signal in FIG. 4, in accordance with a representative embodiment.

FIG. 5 illustrates an invariant w(t) for the phase modulate signal in FIG. 4, in accordance with a representative embodiment.

While all the collected points form a cloud in the complex plain, the average is a complex number whose angle represents the second phase difference. The average second phase difference of the points in FIG. 5 is equal to about −0.002 rad. The spectrum of W(f) is shown in FIG. 6.

Figure 6:
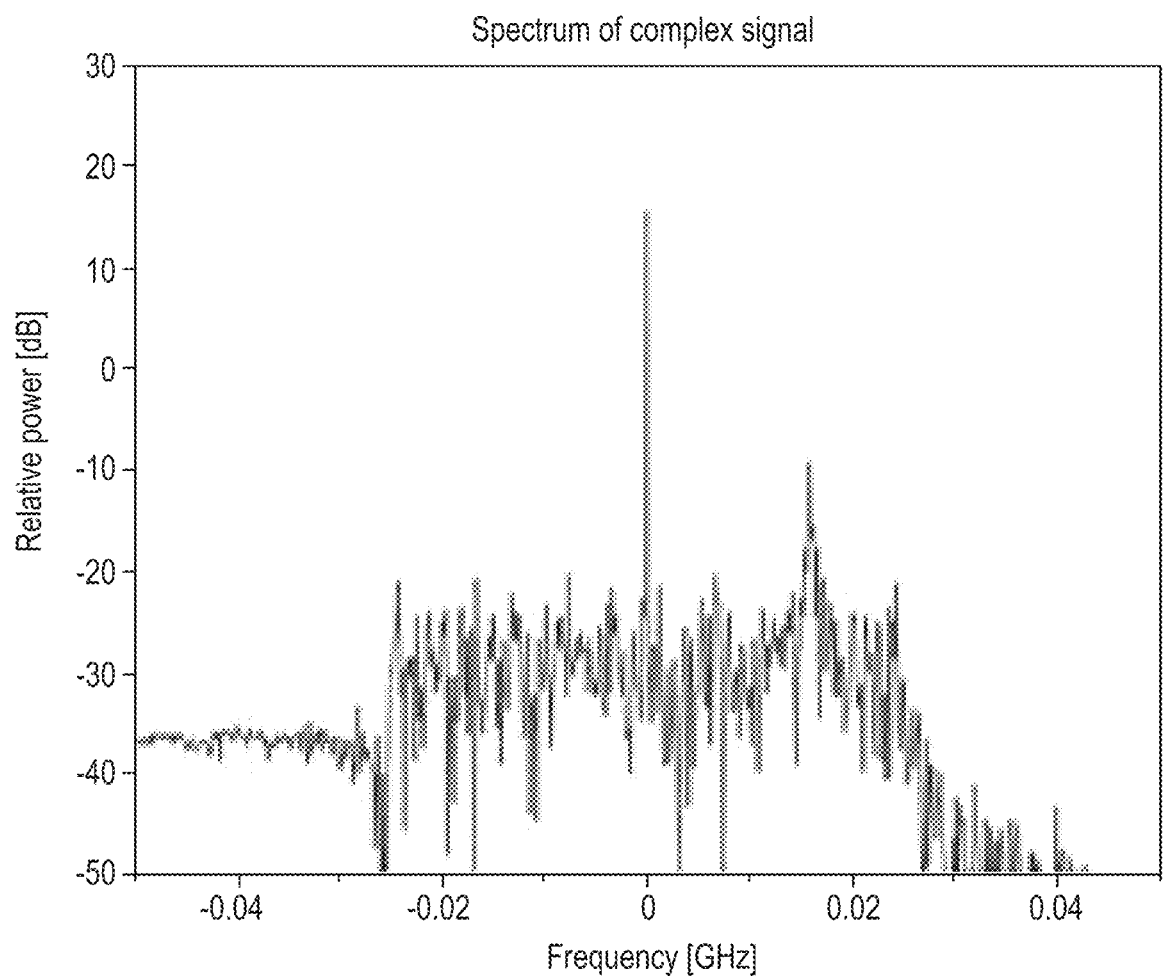
FIG. 6 illustrates spectrum of the invariant w(t) in FIG. 5, in accordance with a representative embodiment.

FIG. 6 illustrates spectrum of the invariant w(t) in FIG. 5, in accordance with a representative embodiment.

As shown in FIG. 6, the width of the peak centered at 0 Hz is within one bin of the DFT. Thus, the phase noise of the lasers was successfully removed. The additive noise is about 35 dB below the peak. At the frequency of approximately 15.8 MHz there is a spur that can be filtered.

Figure 7:
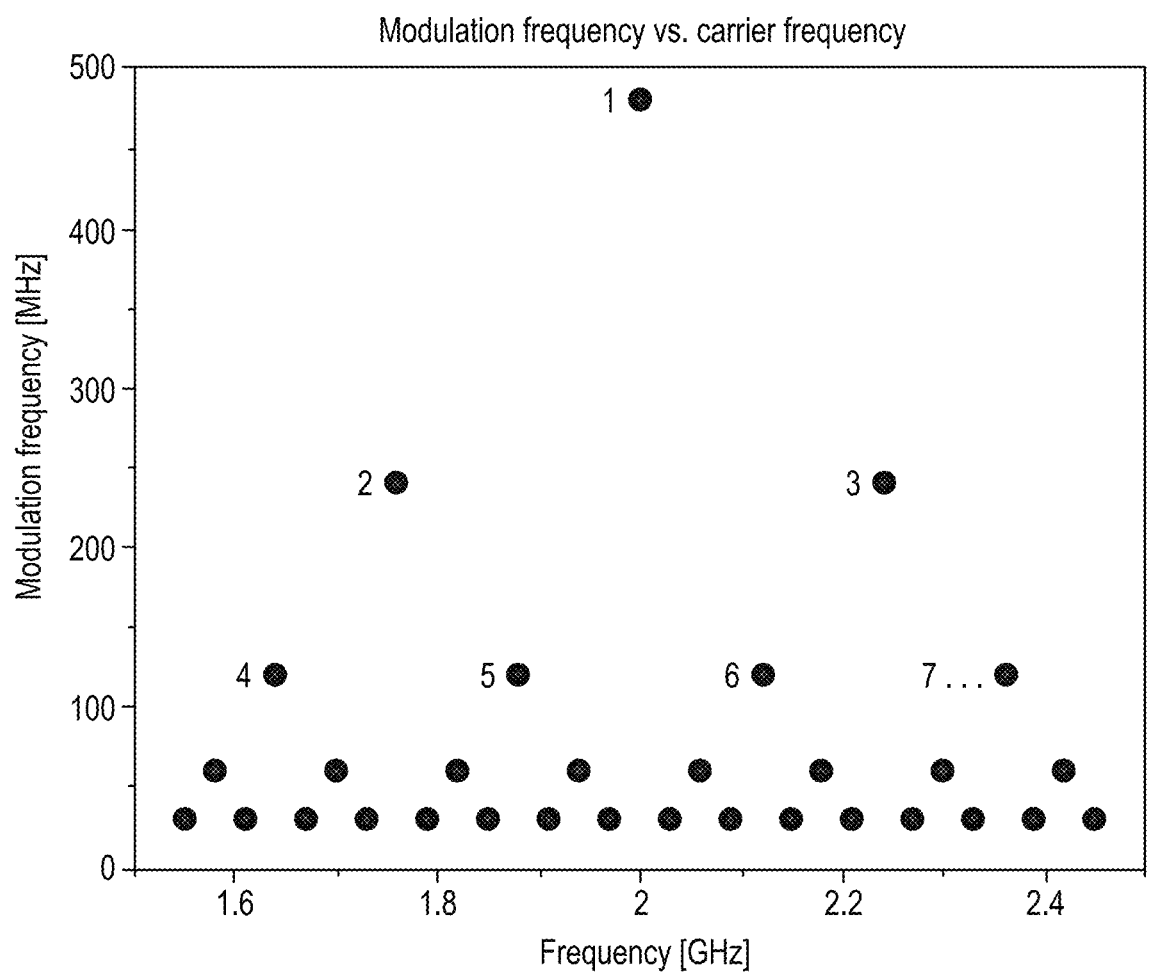
FIG. 7 illustrates a binary tree for a selection of carrier frequencies and modulation frequencies, in accordance with a representative embodiment.

FIG. 7 illustrates a binary tree for a selection of carrier frequencies and modulation frequencies, in accordance with a representative embodiment.

In the multi-resolution method of phase estimation, the selection of carrier frequencies and modulation frequencies takes a form of a binary tree illustrated in FIG. 7.

The top of the tree is the carrier frequency at the center frequency of the tunable receiver. The modulation frequency is selected to produce sidebands at the edges of the receiver bandwidth. In this case, the carrier frequency is equal to 2 GHz, the modulation frequency is 480 MHz (the receiver bandwidth is 1 GHz). At the lower level of the tree, the modulation frequency is twice lower, i.e., equal to 240 MHz, the carrier frequency is in the center of the left frequency range or right frequency range, i.e., at 2 GHz–240 MHz or 2 GHz+240 MHz. The next level of the tree is formed in the analogous manner by subdivision of the modulation frequency and the frequency ranges. In FIG. 5 there are five levels of the binary tree. The individual measurements can be performed sequentially from the lowest to the highest carrier frequency while modulation frequencies are selected according to the binary tree diagram.

The reconstruction of phase begins from the top of the tree and the assumption that the phase is equal to zero at the edges. Then, it proceeds to the lower level of the tree using now a known phase at the edges of each sub frequency range. At each tree level phase is calculated in accordance with (20). The multi-resolution approach minimizes errors that would be present in the summation of sequential phase differences. The example of the reconstructed phase is shown in FIG. 8 for the 1 GHz wide tunable receiver at the center frequency of 40 GHz.

Figure 8:
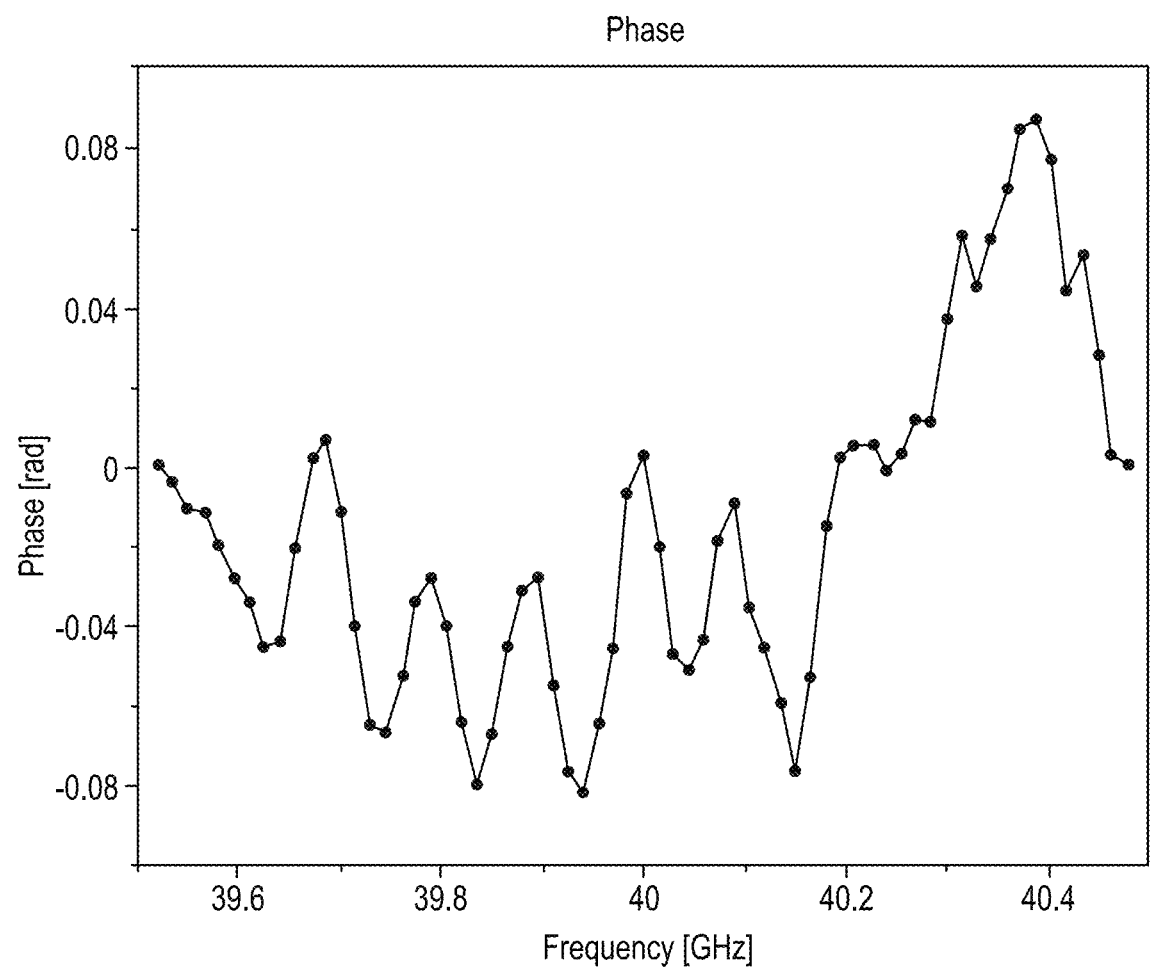
FIG. 8 illustrates a reconstructed phase for a tunable receiver, in accordance with a representative embodiment.

FIG. 8 illustrates a reconstructed phase for a tunable receiver, in accordance with a representative embodiment.

To verify the correctness of the measured phase we used a known device under test (DUT) comprising a 1.7 GHz low pass filter (LPF). First, the amplitude and phase response of the filter may be measured using a classical vector network analyzer (VNA). Then, the receiver may be tuned to 1.5 GHz and measured across 1 GHz bandwidth. After recording the receiver response, the filter may be inserted between the receiver and the photodiode and both may be measured together. The combined response of the receiver and the filter may be compensated for the prerecorded response of the receiver on its own. Thus, the response of the filter alone may be estimated.

FIG. 9 illustrates an amplitude and phase response of a filter, in accordance with a representative embodiment.

FIG. 9 shows the amplitude and the phase response of the filter using the VNA and the methods described above. In order to match the phase response of the VNA a constant phase slope may be added to the phase estimated in multi-resolution method. The amplitude response may be estimated from monitoring power of the carrier. As will be clear from FIG. 9, the measurements using both methods agree.

Figure 10:
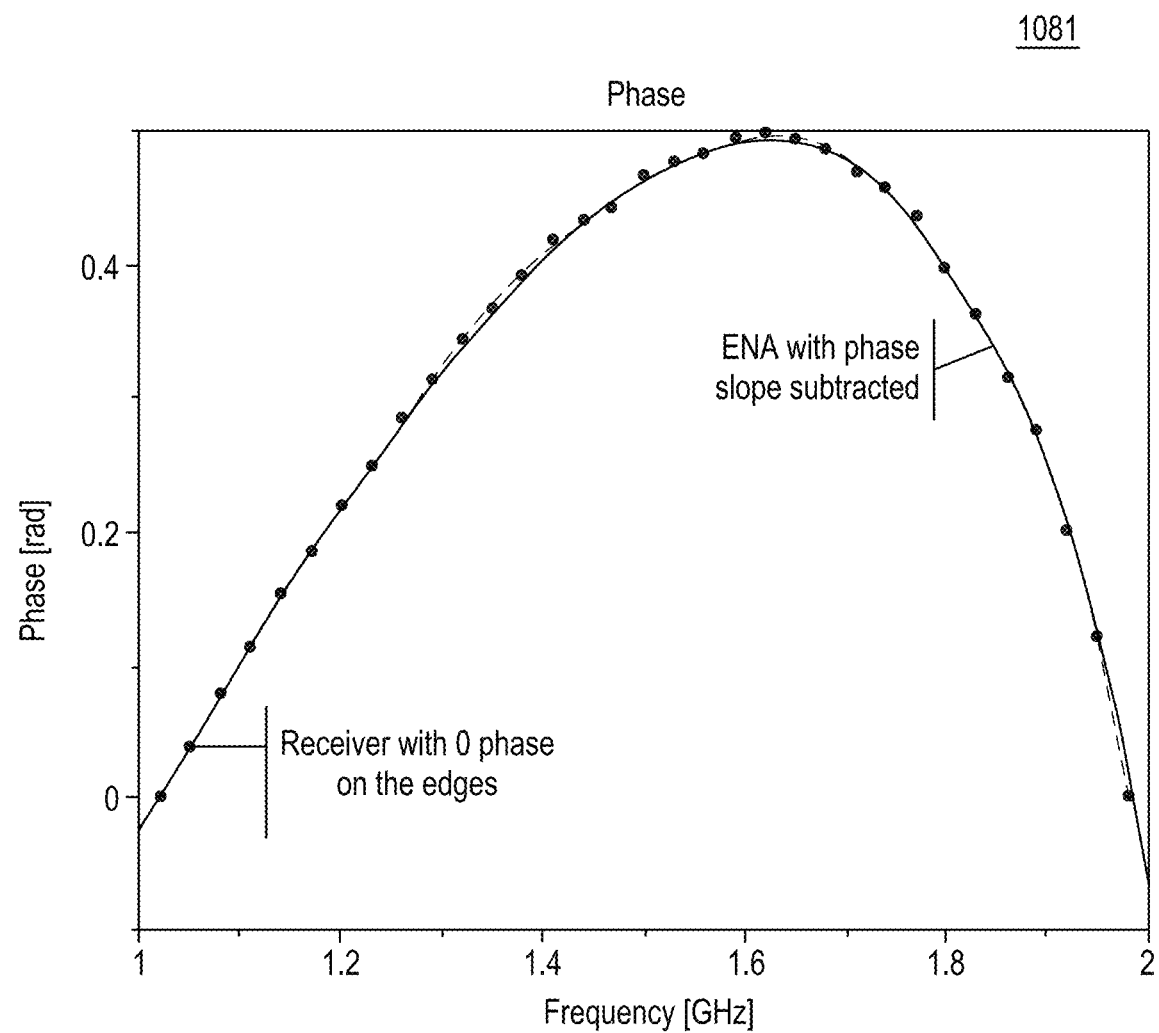
FIG. 10 illustrates a phase response, in accordance with a representative embodiment.

FIG. 10 illustrates a phase response, in accordance with a representative embodiment.

In FIG. 10, the phase has the shape as recovered by the multi-resolution method. The phase at the edges is set to zero and the consequent points are recovered as described earlier using a sequence of a binary tree. The phase measured by the VNA is compensated by a linear phase slope in order to match these data. Again, as will be clear from FIG. 10, both methods agree. Thus, the multi-resolution method is validated. For 6250 samples taken at 1.25 GSa/s (5□s integration time) the second phase difference repeatability is about 0.002 rad (1□).

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing may implement one or more of the methods or functionalities as described herein, and a processor described herein may be used to support a virtual processing environment.

Accordingly, phase distortion measurement enables accurate characterization of phase distortion, such as in high-frequency broadband receivers. The phase distortion measurement described above is primarily directed to characterizing deviations from linear phase. However, amplitude response of a receiver may also be taken into account for response calibration using the teachings herein, so that the use of phase modulation is optional. The description of the amplitude response calibration has been omitted due to its relative simplicity.

Although phase distortion measurement has been described with reference to several exemplary embodiments, it is understood that the words that have been used are words of description and illustration, rather than words of limitation. Changes may be made within the purview of the appended claims, as presently stated and as amended, without departing from the scope and spirit of phase distortion measurement in its aspects. Although phase distortion measurement has been described with reference to particular means, materials and embodiments, phase distortion measurement is not intended to be limited to the particulars disclosed; rather phase distortion measurement extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. A test circuit for measuring phase distortion, the test circuit comprising:
   a first laser tuned to a first frequency f1 and generating a first optical signal;
   a second laser tuned to a second frequency f2 and generating a second optical signal and phase modulating the second optical signal with a periodic signal with a repetition frequency fM; and
   a photo diode that receives and mixes the first optical signal and the second optical signal, and produces a first tone at a third frequency f3, which is a carrier frequency equal to an absolute value of a difference between the second frequency f2 and the first frequency f1, a second tone at a fourth frequency f4 at a difference between the third frequency f3 and the repetition frequency fM, and a third tone at a fifth frequency f5 at a sum of the third frequency f3 and the repetition frequency fM, wherein a receiver-under-test (RUT) is configured to measure a first phasor of the first tone, a second phasor of the second tone, and a third phasor at the third tone, and calculate phase deviations between measurements of the first phasor, the second phasor and the third phasor, and wherein the calculated phase deviations are compared with known phase relationships between the first tone, the second tone and the third tone to measure phase distortion of the RUT.

2. The test circuit of claim 1, wherein phase deviations between measurements of the first phasor, the second phasor and the third phasor are calculated as deviations from linearity at the third frequency f3, the fourth frequency f4 and the fifth frequency f5.

3. The test circuit of claim 1, wherein the first laser and the second laser are tunable.

4. The test circuit of claim 1, further comprising: a signal source that generates the periodic signal, wherein the signal source and the RUT are locked in common to a reference clock.

5. The test circuit of claim 1, wherein the second tone, the first tone and the third tone are separated and expressed as three time varying envelopes P_(t), P0(t) and P+(t) by calculating a discrete Fourier transform (DFT) on a total acquired envelope waveform and applying filters around each of the second tone, the first tone and the third tone, followed by an inverse DFT for each of the second tone, first tone and third tone.

6. The test circuit of claim 1, wherein phase noise is correlated across the second tone, the first tone and the third tone, such that laser phase noise and frequency drift are eliminated from the measured phase distortion.

7. The test circuit of claim 1, wherein the RUT comprises an oscilloscope.

8. A test system for measuring phase distortion, the test system comprising:
   a first laser tuned to a first frequency f1 and generating a first optical signal;
   a second laser tuned to a second frequency f2 and generating a second optical signal and phase modulating the second optical signal with a periodic signal with a repetition frequency fM;
   a photo diode that receives and mixes the first optical signal and the second optical signal, and produces a first tone at a third frequency f3, which is a carrier frequency equal to an absolute value of a difference between the second frequency f2 and the first frequency f1, a second tone at a fourth frequency f4 at a difference between the third frequency f3 and the repetition frequency fM, and a third tone at a fifth frequency f5 at a sum of the third frequency f3 and the repetition frequency fM; and
   a receiver-under-test (RUT) that measures a first phasor M0 of the first tone, a second phasor M_ of the second tone, and a third phasor M+ at the third tone, and that calculates phase deviations between measurements of the first phasor M0, the second phasor M_ and the third phasor M+, wherein the calculated phase deviations are compared with known phase relationships between the first tone, the second tone and the third tone to measure phase distortion of the RUT.

9. The test system of claim 8, wherein phase deviations between measurements of the first phasor M0, the second phasor M_ and the third phasor M+ are calculated as deviations from linearity at the third frequency f3, the fourth frequency f4 and the fifth frequency f5.

10. The test system of claim 8, wherein the first laser and the second laser are tunable.

11. The test system of claim 8, further comprising a signal source that generates the periodic signal, wherein the signal source and the RUT are locked in common to a reference clock.

12. The test system of claim 8, wherein the second tone, the first tone and the third tone are separated and expressed as three time varying envelopes P_(t), P0(t) and P+(t) by calculating a discrete Fourier transform (DFT) on a total acquired envelope waveform and applying filters around each of the second tone, the first tone and the third tone, followed by an inverse DFT for each of the second tone, the first tone and the third tone.

13. The test system of claim 8, wherein phase noise is correlated across the second tone, the first tone and the third tone, such that laser phase noise and frequency drift are eliminated from the measured phase distortion.

14. The test system of claim 8, wherein the RUT comprises an oscilloscope.

15. The test system of claim 8, wherein the known phase relationships are expressed by $\arg(-(P\_)(P+)(P0)^{\wedge}(-2))=0$, wherein P_ is equal to the second phasor of the second tone, P0 is equal to the first phasor M0 of the first tone, and P+ is equal to the third phasor M+ of the third tone.

16. The test system of claim 8, wherein the second phasor M_ is given by $M\_=P\_H(fC-fM)\exp(j(\theta LO+2\pi(fC-fM)\tau))$, the first phasor M0 is given by $M0=P0\ H(f\_C)\exp(j(\theta LO+2\pi fC)\tau))$, and the third phasor M+ is given by $M+=P\_H(f\_C+fM)\exp(j(\theta LO+2\pi(fC+fM)\tau))$, with $\theta LO$ being an unknown phase of a local oscillator at the RUT and with $\tau$ being an unknown delay of the RUT.

17. The test system of claim 16, wherein a measured phase distortion is equal to arg(−M_ M+M0^(−2))=θD=arg (H(fC−fM) H(fC+fM)H(fC)^(−2))=arg(H(fC−fM))+arg(H (fC+fM))−2 arg(H(fC)).

18. The test system of claim 17, wherein the measured phase distortion is not dependent on θLO the unknown phase of the local oscillator and τ, and wherein the measured phase distortion represents a second order difference of the phase of a frequency transfer function H(f).

19. A test method for measuring phase distortion, the test method comprising:
   generating a first optical signal from a first laser tuned to a first frequency f1;
   generating a second optical signal from a second laser tuned to a second frequency f2 and phase modulating the second optical signal with a periodic signal with a repetition frequency fM;
   mixing, by a photo diode, the first optical signal and the second optical signal; and
   producing, by the photo diode, a first tone at a third frequency f3, which is a carrier frequency equal to an absolute value of a difference between the second frequency f2 and the first frequency f1, a second tone at a fourth frequency f4 at a difference between the third frequency f3 and the repetition frequency fM a third tone at a fifth frequency f5 at a sum of the third frequency f3 and the repetition frequency fM, wherein a receiver-under-test (RUT) is configured to measure a first phasor of the first tone, a second phasor of the second tone, and a third phasor at the third tone, and calculate phase deviations between measurements of the first phasor, the second phasor and the third phasor, and wherein the calculated phase deviations are compared with known phase relationships between the first tone, the second tone and the third tone to measure phase distortion of the RUT.

20. The test method of claim 19, wherein phase noise is correlated across the second tone, the first tone and the third tone, such that laser phase noise and frequency drift are eliminated from the measured phase distortion.

* * * * *